United States Patent [19]
Dallmann et al.

[11] Patent Number: 5,809,040
[45] Date of Patent: Sep. 15, 1998

[54] TESTABLE CIRCUIT CONFIGURATION HAVING A PLURALITY OF IDENTICAL CIRCUIT BLOCKS

[75] Inventors: Achim Dallmann, Baldham; Hans-Joergen Bode, Munich, both of Germany

[73] Assignee: Siemens Aktiengesellschaft, Munich, Germany

[21] Appl. No.: 723,771

[22] Filed: Sep. 30, 1996

[30] Foreign Application Priority Data

Sep. 28, 1995 [DE] Germany .................. 195 36 226.8

[51] Int. Cl.⁶ .................................................. G01R 31/28
[52] U.S. Cl. ................................... 371/25.1; 365/201
[58] Field of Search ................... 371/25.1, 22.31, 371/22.32, 22.34, 22.36, 22.5, 27.5, 21.1, 27.7, 21.6; 365/201, 189.02, 189.04, 189.07; 324/73.1, 765; 395/183.06, 183.01, 183.18, 185.01

[56] References Cited

U.S. PATENT DOCUMENTS

| | | |
|---|---|---|
| 4,357,703 | 11/1982 | Van Brunt . |
| 4,534,028 | 8/1985 | Trischler . |
| 4,752,929 | 6/1988 | Kantz et al. .................. 371/21 |
| 4,768,194 | 8/1988 | Fuchs ............................ 371/21 |
| 4,918,379 | 4/1990 | Jongepier .................... 324/73.1 |
| 5,017,810 | 5/1991 | Nakano et al. ............... 307/465 |
| 5,155,432 | 10/1992 | Mahoney .................... 324/158 R |
| 5,260,949 | 11/1993 | Hashizume et al. ........... 371/22.3 |
| 5,294,882 | 3/1994 | Tanaka ....................... 324/158 R |
| 5,459,738 | 10/1995 | Watari . |

FOREIGN PATENT DOCUMENTS

| | | |
|---|---|---|
| 0 144 078 A2 | 6/1985 | European Pat. Off. . |
| 31 30 714 A1 | 5/1982 | Germany . |
| 39 13 219 C2 | 6/1992 | Germany . |

*Primary Examiner*—Robert W. Beausoliel, Jr.
*Assistant Examiner*—Nadeem Iqbal
*Attorney, Agent, or Firm*—Herbert L. Lerner; Laurence A. Greenberg

[57] ABSTRACT

A circuit configuration includes a plurality of identical circuit blocks, at least one input terminal, at least one output terminal, a comparison device and a controlled switching device. The controlled switching device is to be connected to the identical circuit blocks, to the comparison device, to the at least one input terminal and to the at least one output terminal for coupling the identical circuit blocks to each other. The controlled switching device couples the at least one input terminal to the input side of the identical circuit blocks for supplying a path for input test patterns from the at least one input terminal to the identical circuit blocks. The controlled switching device couples the output side of the identical circuit blocks to the comparison device for supplying a path for output test patterns from each of the identical circuit blocks to the comparison device. The comparison device compares the output test patterns from each of the identical circuit blocks, and the comparison device generates an error signal after detecting incompatible test output patterns for external processing. The controlled switching device also couples the comparison device to the at least one output terminal.

16 Claims, 2 Drawing Sheets

TESTABLE CIRCUIT CONFIGURATION HAVING A PLURALITY OF IDENTICAL CIRCUIT BLOCKS

BACKGROUND OF THE INVENTION

FIELD OF THE INVENTION

The invention relates to a circuit configuration having a plurality of identical circuit blocks being connected to each other in any order.

The increasingly denser placement of components on assembly holders or in integrated circuits no longer permits individual in the future. This reduces the possibility of performing quality inspections or rapid fault diagnosis tests on site. For this reason, the Joint Test Action Group (JTAG) has defined a Standard Test Access Port and a Boundary Scan Architecture (cf. IEEE Standard 1149.1/D6, Standard Test Access Port and Boundary Scan Architecture, Draft, Nov. 22, 1989). In a circuit configuration in accordance with this standard, test patterns in particular are read in series via external connections into a circuit block that has been isolated especially for the purpose of testing, and after processing by the circuit block, the resulting output test pattern is read out in series. In this way, each individual block in succession is isolated by itself and tested individually.

Today, new types of circuit blocks or circuit blocks that already exist individually (macros) are often used in a module. If a plurality of these circuit blocks are used, this multiplies the testing time due to the serial nature of the tests—which are basically identical—and thereby influences not only the cost of testing but also the overall cost of the modules.

SUMMARY OF THE INVENTION

It is accordingly an object of the invention to provide a circuit configuration having a plurality of identical circuit blocks, which overcomes the herein mentioned disadvantages of the heretofore-known devices of this general type, and which can be tested in less time.

With the foregoing and other objects in view there is provided, in accordance with the invention, a circuit configuration, comprising a plurality of identical circuit blocks each having an input side and an output side; at least one input terminal; at least one output terminal; a comparison device; the controlled switching device to be connected to the identical circuit blocks, to the comparison device, to the at least one input terminal and to the at least one output terminal for coupling the identical circuit blocks to each other; the controlled switching device couples the at least one input terminal to the input side of the identical circuit blocks for supplying a path for input test patterns from the at least one input terminal to the identical circuit blocks; the controlled switching device couples the output side of the identical circuit blocks to the comparison device for supplying a path for output test patterns from each of the identical circuit blocks to the comparison device; the comparison device comparing the output test patterns from each of the identical circuit blocks, and the comparison device generating an error signal after detecting incompatible test output patterns for external processing; and the controlled switching device coupling the comparison device to the at least one output terminal.

In accordance with an added feature of the invention, the controlled switching device couples the output side of the identical circuit blocks to the at least one output terminal for providing a path to transmit the output test patterns from the identical circuit blocks to the at least one output terminal.

In accordance with an additional feature of the invention, the invention includes a clock conditioning device connected to the at least one input terminal for receiving a test clock signal from the input terminal. The clock conditioning device generating a sampling control signal triggered by a leading edge of the test clock signal, and the sampling control signal having shorter pulses than a period length of the test clock signal. A sampling device connected to the clock conditioning device and connected to the comparison device. The clock conditioning device supplying the sampling control signal to the sampling device. The comparison device supplying the error signal to the sampling device, and the sampling device sampling the error signal in sequence with the sampling control signal. The sampling device is connected to the at least one output terminal for transmitting the error signal.

In accordance with another feature of the invention, the circuit configuration includes the clock conditioning device generating another sampling control signal triggered on a trailing edge of the test clock signal and supplying the other sampling control signal to the sampling device. The comparison device generating another error signal and supplying the other error signal to the sampling device, and the sampling device sampling the other error signal in sequence with the other sampling control signal and outputting the other error signal via the at least one output terminal.

In accordance with an added feature of the invention, the test clock signal is asymmetric.

In accordance with an additional feature of the invention, the sampling control signal is supplied to the sampling device for each of the output test patterns from one of the identical circuit blocks. The sampling device outputs the error signal in sequence with the sampling control signal and outputs the error signal to the at least one output terminal.

In accordance with another feature of the invention, the circuit configuration includes a block error register having a number of bits equal to a number of the identical circuit blocks and one of the bits corresponding to the erroneous identical circuit blocks is set when the error signal occurs, and the block error register is connected to the comparison device.

In accordance with an added feature of the invention, the circuit configuration includes an output error register having a bit width corresponding to a number of bits of the output test patterns where one of the bits of the output error register corresponds to the erroneous bit of the output test pattern being set whenever the error signal occurs. The output error register is connected to the comparison device.

In accordance with an additional feature of the invention, the block error register is connected to the at least one output terminal and the contents of the block error register are shifted out in series via the at least one output terminal when the error signal occurs.

In accordance with another feature of the invention, the output error register is connected to the at least one output terminal and the contents of the output error register are shifted out in series via the at least one output connection when the error signal occurs.

In accordance with an added feature of the invention, the comparison device is supplied with a comparison vector from the at least one input terminal, and the comparison device compares the comparison vector with the output test patterns of the identical circuit blocks and generates the error signal when deviations occur.

In accordance with an additional feature of the invention, the circuit configuration includes a series/parallel converter connected between the at least one input terminal and the identical circuit blocks for inputting the input test patterns. One parallel/series converter connected between the comparison device and the at least one output terminal; and another parallel/series converter connected between the identical circuit blocks and the at least one output terminal for outputting the test output patterns.

In accordance with another feature of the invention, the circuit configuration includes a series/parallel converter connected between the at least one input terminal and the comparison device for inputting a comparison vector. Another switching device is connected to the at least one output terminal and switches between the comparison device and an output device.

In accordance with an added feature of the invention, the circuit configuration includes a control device connected between the block error register and the at least one output terminal.

In accordance with an additional feature of the invention, the output test patterns change simultaneously and that the results of an internal comparison are linked with each other and guided to the outside as a single signal.

In accordance with another feature of the invention, the contents of the block error register are deleted again after the contents have been shifted out, so as to allow for another output when another error signal occurs.

In accordance with a concomitant feature of the invention, the contents of the output error register are deleted again after the contents have been shifted out, so as to allow for another output when another error signal occurs.

In accordance with the invention, all identical circuit blocks are switched in parallel to each other on the input side during test operation, and their output signals are compared with each other by means of a comparison device. One of the identical circuit blocks can be switched on the input side and on the output side to the outside, whereby the operability of said circuit block can be tested in full, and the other identical circuit blocks are then compared with this one circuit block.

In order to compare the individual circuit blocks, the output signals of the circuit blocks can be linked to each other via EXOR gates and sampled whenever a sampling control signal (strobe signal) occurs. The result of this comparison can be output by means of a flipflop and a multiplexer via an output connection, for example the TDO output connection in a Boundary Scan Interface. In the case of an error-free test, this output connection has, for example, the logic state "L", which switches to the logic state "H" when an error occurs. The strobe signal is derived from an edge of a test clock signal supplied externally via an input connection and is relatively short in comparison with this. The strobe signal results in a fixed sampling instant for all outputs of the circuit block, wherein all output signals of the circuit block are checked in all clock phases. In addition, it is possible to define the error with respect to time.

It is also possible to generate two strobe signals, of which one, for example, is derived from the trailing edge and the other from the leading edge of the externally supplied clock signal. The two strobe signals are used for comparing two independent groups of output signals. With two sampling instants, for example, it is possible to carry out a comparison at the end of the state "H" of the external clock signal and the end of the state "L" on different outputs of the circuit blocks. In this way, the sampling instants can be freely selected and varied to a large extent through an asymmetrical external clock signal.

Assuming that there are sufficient external connections on the module in the case of a test, the number of strobe connections, by means of which the external strobe signals can be supplied, can correspond to the number of outputs of the circuit blocks. This results in a freely selectable sampling instant for each output, so that, for example, the outputs can be compared for interesting cycles only.

There can also be an error register, where one bit is associated with each one of the identical circuit blocks. The output signal of the comparison device or of the sampling device sets a corresponding bit in this register, in accordance with the circuit block, whenever an error occurs. If a plurality of circuit blocks fail in the same sequence, so too can a plurality of bits be set. Once the register has been set for the first time, it can be blocked in order to prevent misinterpretation through subsequent errors. At the end of the test, the error register can be read out and the first circuit block to fail can thereby be pinpointed. Using the error register, for example, it is possible to determine the failure sequence for certain circuit blocks.

It is also possible to implement an output error register, where one bit of the register is associated with each output of the circuit blocks. The bits in the output error register are, for example, set by the comparison device or the sampling device. At the end of the test, the register can be read out, and the erroneous output thereby pinpointed. The failure sequence can also be determined via the external test data output.

In one embodiment there is a block error register as well as an output error register. When one or more errors occur, the registers are written to and their contents are shifted to the outside in series via a test data output connection. Here, the signal on the test data output connection is, for example, constantly kept on the logic state "L", and in the case of an error, a state "H" is first output, and then the contents of both registers are output in series in a suitable form. The individual bits or the registers and any feedthrough of recognition bits can thereby occur in any order. In this way, the registers do not need to be explicitly read out at the end of the test; after an error, the comparison result lies in series on the test data output connection in the subsequent sequences. Furthermore, errors can also be detected repeatedly by deleting the registers again several sequences after the error occurs; if another error occurs, the error can be signaled again in the manner just described.

In another embodiment, no outputs for output test patterns are switched to the outside; instead, a comparison vector is applied via other input connections. This vector is compared with the output test patterns of all identical circuit blocks and only the result is switched to the outside, or it is stored in a block error register and an output error register. Both registers can be evaluated in a different manner, as already described. The advantage of this embodiment is that a large number of multiplexers and outputs can be eliminated; this is necessary, in particular, if the circuit blocks in question supply no or very few output signals to the outside in normal operation. As a rule, this results in simpler signaling for the module layout.

In another embodiment, the module is designed as an integrated circuit. This contains at least one serial interface, by means of which the input test patterns can be entered and/or the output test patterns can be output and/or the comparison vector can be entered. The clock frequency of the module and the transmission rate of the serial interfaces can differ from each other. It is advantageous if no additional connections and multiplexers are required.

Another possibility is to integrate the comparison device in the circuit and, in the test, to switch the comparison result to the outside via unused output connections. These output connections are then sampled externally by means of a strobe signal. There is therefore no need to supply strobe signals to the module.

If all the various output signals of the individual circuit blocks change at one time, or at least, at defined times, as for example after a clock pulse, and if all outputs are sufficiently defined through a complete reset, the different comparison signals can also be AND-operated internally, and a single comparison signal is sufficient, which may have to be sampled externally at different instants specified by the strobe signal.

Other features of the invention are set forth in the appended claim.

Although the invention is illustrated and described herein as embodied in a testable circuit configuration having a plurality of identical circuit blocks, it is nevertheless not intended to be limited to the details shown, since various modifications and structural changes may be made therein without departing from the spirit of the invention and within the scope and range of equivalents of the claims.

The construction of the invention, however, together with additional objects and advantages thereof will be best understood from the following description of the specific embodiment when read in connection with the accompanying drawings.

DESCRIPTION OF THE PREFERRED EMBODIMENTS

Figure 1:
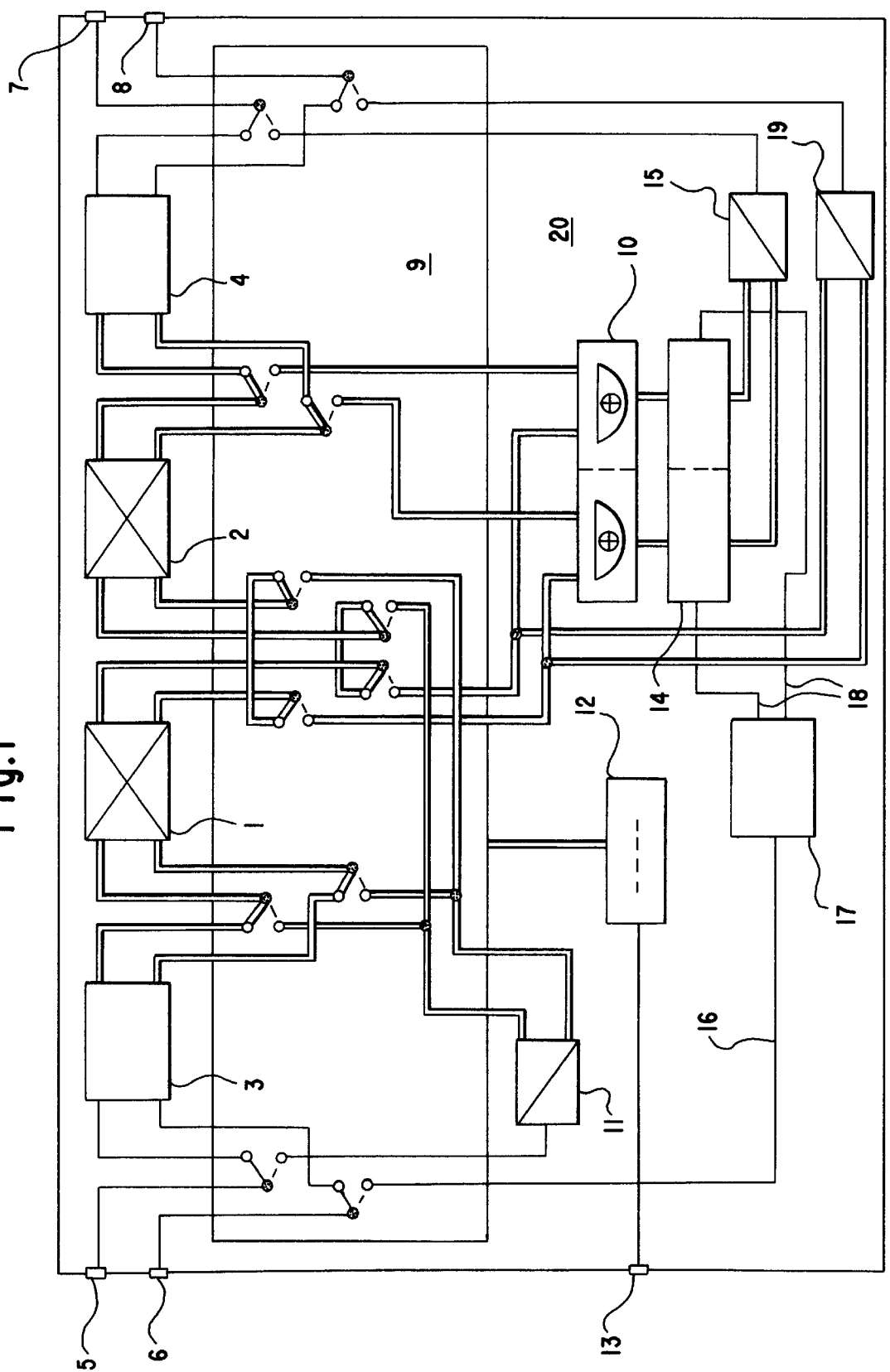
FIG. 1 is a circuit diagram of a first embodiment of a circuit configuration according to the invention.

Referring now to the figures of the drawing in detail and first, particularly, to FIG. 1 thereof, there is shown two identical circuit blocks 1 and 2, having an input side and an output side, as well as an input unit 3 and an output unit 4. It should therefore be possible to supply external signals via two input connections or terminals 5 and 6, and to accept output signals via two output connections or terminals 7 and 8. The input connections 5 and 6, the input unit 3, the circuit blocks 1 and 2, the output unit 4 as well as the output connections 7 and 8 are connected with a switching device 9 such that, in normal operation, the input unit 3 is switched to the input connections 5 and 6, and the output unit 4 is switched to the output connections 7 and 8, wherein the circuit blocks 1 and 2 are switched, for example, in series between the input unit 3 and the output unit 4. During test operation, the circuit blocks 1 and 2 are switched in parallel on the input side and their output signals are fed to a comparison device 10. Input test patterns are applied at the inputs of the circuit blocks 1 and 2. In the present embodiment, the input test patterns are made available by a series/parallel converter 11, which is switched to the input connection 5 on the input side during test operation. The input test patterns are thereby entered in series into the series/parallel converter 11 via the input connection.

The switching device 9 is controlled, for example, by means of a test register 12, which can then be controlled with a test mode connection terminal 13. The test register 12 is used for storing the switching sequence for the switching device 9, which is activated by a corresponding signal on the test mode input terminal 13.

The output test patterns of both the switching blocks 1 and 2 can be divided into two different groups in the present exemplary embodiment. These two groups are compared with each other separately through the comparison device 10, forming two different comparison results or error signals. The comparison is made, for example, through EXOR operation of corresponding bits of the output test patterns provided by the circuit blocks 1 and 2. The comparison results are sampled for each group alternately by a sampling device 14, and the resulting sampling values are fed to a parallel/series converter (one parallel/series converter) 15. The sampling instant of one group depends on a leading edge, and the sampling instant of the other group depends on a trailing edge of a test clock signal 16. During test operation, the test clock signal 16 is fed via the input connection 6 and the switching devices 9 to a signal conditioning device 17, which thereby generates multiple sampling control signals 18 for controlling the sampling device 14. The output test patterns change simultaneously and the results of an internal comparison are linked with each other and guided to the outside as a single signal. Finally, there is a parallel/series converter (another parallel/series converter) 19, which is connected to the outputs of the first switching block 1 on the input side and of which the serial output is switched to the output connection 8 via the switching device 9 during test operation. The output test patterns of the switching block 1 can then be read out in series via the output connection 8.

Figure 2:
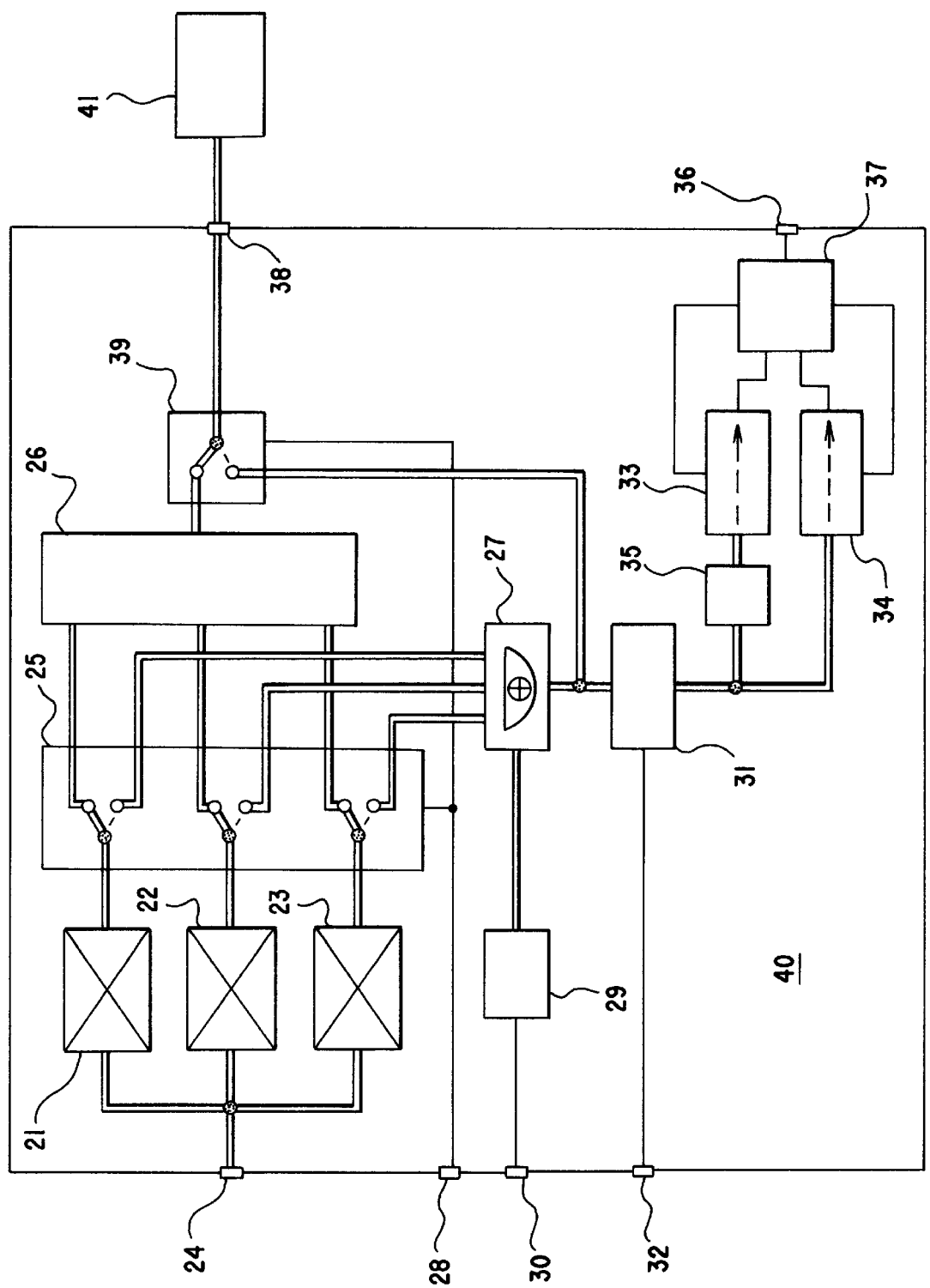
FIG. 2 is a circuit diagram of a second embodiment of the circuit configuration.

In the exemplary embodiment shown in FIG. 2, there are three identical switching blocks 21, 22 and 23 in an integrated circuit 40. The switching blocks 21, 22 and 23 are switched in parallel to each other in normal operation as well as in test operation and can be controlled from the outside via a plurality of input connections or terminals 24. Outputs of the switching blocks 21, 22 and 23 are connected to a switching device 25 which switches the outputs of the switching blocks 21, 22 and 23 to an output unit 26 in normal operation and to a comparison device 27 in test operation. The switching device 25 is designed, for example, as a triple data multiplexer, which is switched over by a control signal, fed via an input connection or terminal 28, for the relevant operation.

During test operation, the comparison device 27 compares the output test patterns of the switching blocks 21, 22 and 23 with a separate comparison vector, which is made available by a series/parallel converter 29. The series/parallel converter 29 is supplied with the comparison vector in series via an input connection or terminal 30. The comparison results of the comparison device 27 are sampled by a sampling device 31 at specified instants that are dependent on the strobe signal supplied via an input connection or terminal 32. Then, dependent on the sampled comparison result, the corresponding bits are set in an output error register 33 and a block error register 34. If a plurality of the switching blocks fail in the same sequence, a plurality of bits can be set. The output error register 33 is set via an allocation matrix 35, which is switched in parallel to the block error register 34 on an input side. Once the register has been set for the first time, it can be blocked in order to prevent misinterpretation through subsequent errors. In the event of an error, the contents of both the registers 33 and 34 are shifted out in series via output connection or terminal 36. The two registers 33 and 34 are monitored and also controlled by means of a control device 37. In normal operation, this continuously generates the logic state "L". In the event of an error, the logic state "H" is first output, followed by the contents of the two registers 33 and 34, for example, in succession. Special recognition bits are transmitted in order to separate the contents of the two registers and to allocate the contents to the relevant register.

Finally, in the present exemplary embodiment, the parallel output of an output device 26 is separated from an external output connections or terminals 38 during test operation by means of another switching device 39, assuming the other switching device 39 receives a corresponding signal via the input connection 28. In this case, the output connections 38 are switched to the output of the comparison device 27 and thereby provide for direct access from the outside to the results of the comparison. It is therefore possible to sample and evaluate the comparison results externally. This is done, for example, with an external evaluation device 41.

Apart from the embodiments shown here as exemplary embodiments, the invention can also be applied to any structured circuit configuration having any number of the identical circuit blocks. Furthermore, it is also possible to use the invention for a plurality of groups each having its own identical circuit blocks. The invention can be applied equally well to all types of devices, i.e. to integrated circuits and/or modules, on their own or in connection with each other. The existing input/output devices, specifically the parallel/series converters and the series/parallel converters, can be used, even in test operation.

When parallel tests are made, time-critical tests can be eliminated since these are covered by function tests for the overall functioning of the module. It is sufficient to verify the logic functioning within the circuit blocks, where tests on various outputs of the circuit blocks can be grouped together in terms of time. As a rule, there will always be spikes in the comparison result through minor differences in the individual circuit blocks. This can be avoided by setting the sampling instants appropriately. In the case of a clock-pulse controlled device, for example, having only one clock input and only one triggering edge, the comparison can be made shortly before the end of a cycle. For tristate outputs, it is sufficient in the case of tristates to compare the internal tristate control signals with each other, even if the data lines are different. In general, most of the input and output connections, including any existing interfaces, can be used in normal operation as well as in test operation by suitably designing the switching devices and/or using additional switching devices; this minimizes the overall number of the connections required. Even the most simple implementation of the invention can discover a malfunction. The further developments of the invention serve primarily to analyze and pinpoint the malfunction.

If all of the various output signals of the individual circuit blocks change at the same time or at a small number of fixed instants, for example, after a clock pulse, and if all of the outputs are sufficiently defined by a complete reset, the different comparison results can also be AND-operated, for example, internally, and all that is required is one single comparison signal, which can be sampled externally at various instants.

Furthermore, for example, in addition to an on-chip parallel test by means of more multiplexers, the outputs of further or of all individual circuit blocks and of other circuit parts can be switched to the outside. In the case of a function test, an indication that a circuit block has failed is sufficient. For error analysis, however, the individual block must undergo a complete test. Nevertheless, the process in accordance with the invention can also cut down on testing time in this case, because a precise analysis need only be performed if the on chip test has indicated an error. In addition, the data on which the comparison is based or which represent the comparison result can be input and output via JTAG-standard test data input and output connections respectively (TDI, TDO).

We claim:

1. A circuit configuration, comprising:

a plurality of identical circuit blocks each having an input side and an output side;

at least one input terminal;

at least one output terminal;

a comparison device;

a controlled switching device to be connected to said identical circuit blocks, to said comparison device, to said at least one input terminal and to said at least one output terminal for coupling said identical circuit blocks to each other;

said controlled switching device coupling said at least one input terminal to said input side of said identical circuit blocks for supplying a path for input test patterns from said at least one input terminal to said identical circuit blocks;

said controlled switching device coupling said output side of said identical circuit blocks to said comparison device for supplying a path for output test patterns from each of said identical circuit blocks to said comparison device;

said comparison device comparing the output test patterns from each of said identical circuit blocks, and said comparison device generating an error signal after detecting incompatible test output patterns for external processing;

said controlled switching device coupling said comparison device to said at least one output terminal;

a clock conditioning device connected to said at least one input terminal for receiving a test clock signal from said at least one input terminal;

said clock conditioning device generating a sampling control signal triggered by a leading edge of the test clock signal, and said sampling control signal having shorter pulses than a period length of the test clock signal;

a sampling device connected to said clock conditioning device and connected to said comparison device;

said clock conditioning device supplying said sampling control signal to said sampling device, said comparison device supplying said error signal to said sampling device, and said sampling device sampling said error signal in sequence with said sampling control signal; and said sampling device connected to said at least one output terminal for transmitting said error signal.

2. The circuit configuration according to claim 1, wherein said controlled switching device couples said output side of said identical circuit blocks to said at least one output terminal for providing a path to transmit the output test patterns from said identical circuit blocks to said at least one output terminal.

3. The circuit configuration according to claim 1, including:

said clock conditioning device generating another sampling control signal triggered on a trailing edge of the test clock signal and supplying said other sampling control signal to said sampling device;

said comparison device generating another error signal and supplying said other error signal to said sampling device, and said sampling device sampling said other error signal in sequence with said other sampling control signal and outputting said other error signal via said at least one output terminal.

4. The circuit configuration according to claim 1, wherein the test clock signal is asymmetric.

5. The circuit configuration according to claim 1, wherein said sampling control signal is supplied to said sampling device for each of the output test patterns from one of said identical circuit blocks, said sampling device outputs said error signal in sequence with said sampling control signal and outputs said error signal to said at least one output terminal.

6. The circuit configuration according to claim 1, including a block error register having a number of bits equal to a number of said identical circuit blocks and one of said bits corresponding to said erroneous identical circuit blocks being set when said error signal occurs, and said block error register being connected to said comparison device.

7. The circuit configuration according to claim 1, including an output error register having a bit width corresponding to a number of bits of the output test patterns where one of the bits of said output error register corresponding to the erroneous bit of the output test pattern being set whenever said error signal occurs, and said output error register being connected to said comparison device.

8. The circuit configuration according to claim 6, wherein said block error register is connected to said at least one output terminal and contents of said block error register are shifted out in series via said at least one output terminal when said error signal occurs.

9. The circuit configuration according to claim 7, wherein said output error register is connected to said at least one output terminal and contents of said output error register are shifted out in series via said at least one output connection when said error signal occurs.

10. The circuit configuration according to claim 1, wherein said comparison device is supplied with a comparison vector from said at least one input terminal, and said comparison device compares the comparison vector with the output test patterns of said identical circuit blocks and generates said error signal when deviations occur.

11. The circuit configuration according to claim 1, including:
   a series/parallel converter connected between said at least one input terminal and said identical circuit blocks for inputting the input test patterns;
   one parallel/series converter connected between said comparison device and said at least one output terminal; and
   another parallel/series converter connected between said identical circuit blocks and said at least one output terminal for outputting the test output patterns.

12. The circuit configuration according to claim 1, including:
   a series/parallel converter connected between said at least one input terminal and said comparison device for inputting a comparison vector;
   an output device; and
   another switching device connected to said at least one output terminal and coupling between said comparison device and said output device.

13. The circuit configuration according to claim 6, including a control device connected between said block error register and said at least one output terminal.

14. The circuit configuration according to claim 1, wherein the output test patterns change simultaneously and that the results of an internal comparison are linked with each other and guided to the outside as a single signal.

15. The circuit configuration according to claim 8, wherein the contents of said block error register are deleted again after the contents have been shifted out, so as to allow for another output when another said error signal occurs.

16. The circuit configuration according to claim 9, wherein the contents of said output error register are deleted again after the contents have been shifted out, so as to allow for another output when another said error signal occurs.

* * * * *